United States Patent
Lin et al.

(12)

(10) Patent No.: US 6,210,856 B1
(45) Date of Patent: *Apr. 3, 2001

(54) RESIST COMPOSITION AND PROCESS OF FORMING A PATTERNED RESIST LAYER ON A SUBSTRATE

(75) Inventors: Qinghuang Lin, Wappingers Falls; Timothy M. Hughes, Marlboro; George M. Jordhamo, Hopewell Junction; Ahmad D. Katnani, Poughkeepsie; Wayne M. Moreau, Wappingers Falls, all of NY (US); Niranjan Patel, Fremont, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/238,823

(22) Filed: Jan. 27, 1999

(51) Int. Cl.[7] ............................. G03C 1/725; G03F 7/004
(52) U.S. Cl. ..................................... 430/270.1; 430/281.1; 430/286.1; 430/271.1
(58) Field of Search ............................. 430/270.1, 281.1, 430/286.1, 288.1, 905, 913, 300, 322

(56) References Cited

U.S. PATENT DOCUMENTS

| | | |
|---|---|---|
| 4,770,974 | 9/1988 | Hiraoka . |
| 4,786,577 | 11/1988 | Aoai et al. . |
| 4,788,127 | 11/1988 | Bailey et al. . |
| 4,916,046 | 4/1990 | Doessel . |
| 5,037,721 | 8/1991 | Doessel . |
| 5,229,254 | 7/1993 | Lohaus et al. . |
| 5,338,641 | 8/1994 | Pawlowski et al. . |
| 5,346,803 * | 9/1994 | Crivello et al. ...................... 430/270 |
| 5,457,003 * | 10/1995 | Tanaka et al. ...................... 430/176 |
| 5,683,857 | 11/1997 | Shirai et al. . |
| 5,985,513 * | 11/1999 | Kani et al. ...................... 430/270.1 |
| 6,060,213 * | 5/2000 | Kodama ............................ 430/270.1 |
| 6,087,064 * | 7/2000 | Lin et al. .......................... 430/270.1 |
| 6,096,483 * | 8/2000 | Harkness et al. ................... 430/325 |
| 6,096,850 * | 8/2000 | Chiang et al. ....................... 528/38 |

* cited by examiner

*Primary Examiner*—John S. Chu
*Assistant Examiner*—Yvette M. Clarke
(74) *Attorney, Agent, or Firm*—Scully, Scott, Murphy & Presser; Steven Capella, Esq.

(57) ABSTRACT

A radiation sensitive resist composition exhibiting high resolution and enhanced etch resistance comprising a silicon containing polymeric additive, a non-silicon containing base polymer, a photoacid generator and a base is provided. A method of forming a patterned resist film is also provided. A resist film having an upper surface region enriched with silicon is also disclosed.

26 Claims, No Drawings

RESIST COMPOSITION AND PROCESS OF FORMING A PATTERNED RESIST LAYER ON A SUBSTRATE

FIELD OF THE INVENTION

The present invention relates to a radiation sensitive resist composition and, more particularly to a radiation sensitive resist composition which includes a silicon containing additive, a non-silicon containing base polymer, a photoacid generator and a solvent. The presence of the silicon containing additive in the radiation sensitive resist composition provides high resolution, improved profile control and improved etch resistance in oxygen reactive ion etching. The present invention also provides a film having an enriched surface layer of silicon.

The present invention is also directed to a process of providing a patterned resist film on a substrate, e.g. organic ARC or organic substrate, or other surface utilizing the radiation sensitive resist composition of the present invention.

BACKGROUND OF THE INVENTION

Single layer resists have been the main stream approach for optical lithography. To extend 248 nm optical lithography down to the sub-200 nm regime, high performance resists are required.

One way to extend 248 nm optical lithography to the sub-200 nm regime is to reduce the thickness of the resist film. Another way is to use various wave front engineering techniques, such as phase shift masks. These approaches place stringent lithographic and etch requirements on the single layer resist. These requirements include sub-200 nm resolution, good profile, high etch resistance for bottom ARC (antireflective coating) and substrate etching, and compatibility with phase shift mask technology.

Unfortunately, prior art resists are unable to meet all of these requirements due to several deficiencies which exist with the same. These deficiencies include poor resist profile due to excessive top loss, particularly at small dimensions, and insufficient etch resistance in substrate etch as a result of resist loss during opening of the underlying ARC material. Moreover, the prior art resists tend to give rise to unwanted side slopes when attenuated phase shift masks are used.

Resist compositions containing silicon either in the main resist polymer or by post-exposure surface treatment (e.g., silylation) have either failed to deliver adequate improvement in etch resistance, have had poor processing performance and/or require expensive or undesired process steps.

In view of the deficiencies with prior art resists, there is a need for a resist composition which provides, among other things, high image resolution, good process windows and excellent etch resistance.

SUMMARY OF THE INVENTION

The present invention provides novel radiation sensitive resist compositions which exhibit high image resolution, good image profile and high etch resistance. Specifically, the novel radiation sensitive resist compositions of the invention preferably comprise a silicon-containing polymeric additive, a non-silicon-containing base polymer, a photoacid generator and a solvent, wherein at least one of the polymeric materials contains acid sensitive protecting groups and both polymeric materials are aqueous base soluble after exposure processing, i.e. pre-exposure baking, exposure and post-exposure baking. The pre- or post-baking may be optionally employed herein.

The resist compositions of the invention provide sub-200 nm resolution, good profile, high etch resistance, and no unwanted side slopes when used with attenuated phase shift masks. The high etch resistance property makes the inventive resist compositions particularly suitable for use with organic ARCs.

The resist compositions of the invention are capable of forming a resist film (or layer) having a controlled vertical composition gradient such that the top portion of the unexposed portion of the resist film is less soluble in an aqueous base developer and more etch resistant during bottom ARC etching. The vertical composition gradient provided in the resist film of the invention is achieved by employing a low surface energy silicon-containing polymeric additive which migrates to the surface of the resist film during processing to form a silicon-enriched surface region that is more difficult to etch (e.g., compared to a silicon-free resist or a resist containing a uniform distribution of the silicon-containing polymeric additive). The silicon-containing polymeric additive is preferably hydrophobic.

The radiation sensitive resist compositions of the invention may optionally contain other components such as a base, a photosensitizer and a surfactant.

Another aspect of the invention relates to a film which comprises a silicon-containing polymeric additive and a non-silicon-containing base polymer, wherein the film has a silicon-enriched upper region.

In another aspect, the invention encompasses a method of forming a patterned resist film on a substrate. The method includes applying a layer of the radiation sensitive resist composition of the invention onto a substrate, patternwise exposing the layer to radiation to create regions of enhanced aqueous alkaline solubility, and removing the regions of enhanced aqueous alkaline solubility by application of an aqueous developer having a pH in excess of 7 to provide a patterned resist film having regions of differentially higher silicon content at the upper surface thereof.

The resist compositions of the invention may be used in single layer or multilayer (e.g., so-called bi-layer) resist photolithographic processes.

DETAILED DESCRIPTION OF THE INVENTION

As stated above, the resist compositions of the invention preferably comprise a silicon-containing polymeric additive, a non-silicon containing base polymer, a photoacid generator and a solvent, wherein at least one of the polymeric compounds (i.e., the polymeric additive and/or the base polymer) contains a acid sensitive protecting groups.

The silicon-containing polymeric additive employed in the invention may contain silicon in its polymer backbone, contain silicon as a substituent to a polymer backbone or contain silicon both in the polymer backbone and as a substituent. The silicon containing polymeric additive may additionally contain a acid sensitive protecting groups.

Where silicon is incorporated into the polymer backbone, the silicon-containing polymeric additive employed in the present invention may be a homopolymer or a copolymer. Suitable types of such silicon-containing polymers include homopolymers or copolymers containing at least one monomer selected from the group consisting of a siloxane, a silane, a silsesquioxane and a silyne. Highly preferred silicon-backbone polymers are selected from the group consisting of poly(hydroxyphenyl alkyl)silsesquioxanes and poly (hydroxyphenyl alkyl) siloxanes, wherein alkyl is a $C_{1-30}$ moiety. These preferred silicon-containing polymers are preferably fully or partially protected with acid-sensitive protecting groups.

Where the silicon-containing polymeric additive contains a silicon-containing substituent bonded to the polymeric backbone, the silicon-containing polymeric additive may be a homopolymer or copolymer containing at least one monomer having a silicon-containing substituent. The silicon-containing substituent may or may not be acid sensitive. Typically, however the substituent is acid sensitive when containing a $C_2$ alkyl moiety. Preferably, the silicon-containing substituent is attached to a monomer selected from the group consisting of hydroxystyrene, an acrylate, a methacrylate, an acrylamide, a methacrylamide, itaconate, an itaconic half ester or a cycloolefin. Preferred silicon-containing substituents include: siloxane, silane and cubic silsesquioxanes. The silicon-containing polymer may further include silicon-free monomers such as those selected from the group consisting of styrene, hydroxystyrene, acrylic acid, methacrylic acid, itaconic acid and an anhydride such as maleic anhydride and itaconic anhydride.

Preferred monomers containing silicon-containing substituents are trimethylsilyl alkyl acrylate, trimethylsilyl alkyl methacrylate, trimethylsilyl alkyl itaconate, tris(trimethylsilyl)silyl alkyl acrylate tris(trimethylsilyl)silyl alkyl methacrylate, tris(trimethylsilyl)silyl alkyl itaconate, tris(trimethylsilyloxy)silyl alkyl acrylate, tris(trimethylsilyloxy)silyl alkyl methacrylate, tris(trimethylsilyloxy)silyl alkyl itaconate, alkylsilyl styrene, trimethylsilylmethyl(dimethoxy)silyloxy alkyl acrylate, trimethylsilylmethyl(dimethoxy)silyloxy alkyl methacrylate, trimethylsilylmethyl(dimethoxy)silyloxy alkyl itaconate, trimethylsilyl alkyl norbornene-5-carboxylate alkyl, tris(trimethylsilyl)silyl alkyl norbornene-5-carboxylate and tris(trimethylsilyloxy)silyl alkyl norbornene-5-carboxylate, wherein alkyl is a $C_{1-5}$ moiety.

Highly preferred species of these monomers are 3-(3,5,7,9,11,13,15-Heptacyclopentylpentacyclo[9.5.1.1$^{3,9}$.1$^{5,15}$.1$^{7,13}$]-octasiloxan-1-yl)propyl methacrylate, 1,3,5,7,9,11,13-Heptacyclopentyl-15-vinylpentacyclo[9.5.1.1$^{3,9}$.1$^{5,15}$.1$^{7,13}$]octasiloxane, methacrylamidotrimethylsilane, O-(methacryloxyethyl)-N-(triethoxysilylpropyl)urethane, methacryloxyethoxytrimethylsilane, N-(3-methacryloxy-2-hydroxypropyl)-3-aminopropyltriethoxysilane, (methacryloxymethyl)bis(trimethylsiloxy)methylsilane, (m,p-vinylbenzyloxy)trimethylsilane, methacryloxypropyltris(trimethylsiloxy)silane, methacryloxytrimethylsilane, 3-methacryloxypropylbis(trimethylsiloxy)methylsilane, 3-methacryloxypropyldimethylchlorosilane, methacryloxypropyldimethylethoxysilane, methacryloxypropyldimethylmethoxysilane, methacryloxypropylheptacyclopentyl-T8-silsequioxane, methacryloxypropylmethyldichlorosilane, methacryloxypropylmethyldiethoxysilane, methacryloxypropylmethyldimethoxysilane, (methacryloxymethyl)dimethylethoxysilane, (methacryloxymethyl)phenyldimethylsilane (phenyldimethylsilyl) methylmethacrylate, methacryloxymethyltriethoxysilane, methacryloxymethyltrimethoxysilane, methacryloxymethyltris(trimethylsiloxy)silane, O-methacryloxy(polyethyleneoxy)trimethylsilane, methacryloxypropylpentamethyldisiloxane, methacryloxypropylsilatrane, methacryloxypropylsiloxane macromer, methacryloxypropyl terminated polydimethylsiloxane, methacryloxypropyltrichlorosilane, methacryloxypropyltriethoxysilane, methacryloxypropyltrimethoxysilane, methacryloxypropyltris(methoxyethoxy)silane, p-(t-butyldimethylsiloxy)styrene, butenyltriethoxysilane, 3-butenyltrimethylsilane, (3-acryloxypropyl)trimethoxysilane, (3-acryloxypropyl)tris(trimethylsiloxy)silane, O-(trimethylsilyl)acrylate, 2-trimethylsiloxyethlacrylate, N-(3-acryloxy-2-hydroxypropyl)-3-aminopropyltriethoxysilane, (3-acryloxypropyl)dimethylmethoxysilane, (3-acryloxypropyl)methylbis(trimethylsiloxy)silane, (3-acryloxypropyl)methyldichlorosilane, (3-acryloxypropyl)methyldimethoxysilane, (3-acryloxypropyl)trichlorosilane.

The extent of protection and the amount of co-monomer present in the silicon containing polymeric additive are such that the resist composition will provide good lithography performance, i.e. high resolution and good process window. Examples of protecting groups which can be employed are cyclic and branched (secondary and tertiary) aliphatic carbonyls, esters or ethers containing from 3 to 30 carbon atoms, acetals, ketals and aliphatic silylethers.

Examples of cyclic or branched aliphatic carbonyls that may be employed in the present invention include, but are not limited to: phenolic carbonates; t-alkoxycarbonyloxys such as t-butoxylcarbonyloxy and isopropyloxycarbonyloxy. A highly preferred carbonate that is t-butoxylcarbonyloxy.

Some examples of cyclic and branched ethers that may be employed in the present invention include, but are not limited to: benzyl ether and t-alkyl ethers such t-butyl ether. Of the aforesaid ethers, it is highly preferred to use t-butyl ether.

Examples of cyclic and branched esters that can be employed in the present invention are carboxylic esters having a cyclic or branched aliphatic substituent such as t-butyl ester, isobornyl ester, 2-methyl-2-admantyl ester, benzyl ester, 3-oxocyclohexanyl ester, dimethylpropylmethyl ester, mevalonic lactonyl ester, 3-hydroxy-g-butyrolactonyl ester, 3-methyl-g-butylrolactonyl ester, bis(trimethylsilyl)isopropyl ester, trimethylsilylethyl ester, tris(trimethylsilyl)silylethyl ester and cumyl ester.

Some examples of acetals and ketals that can be employed in the present invention include, but are not limited to: phenolic acetals and ketals as well as tetrahydrofuranyl, tetrahydropyranyl, 2-ethoxyethyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl. Of these, it is preferred that a methoxycyclohexanyl ketal be employed.

Illustrative examples of silylethers that can be employed in the present invention include, but are not limited to: trimethylsilylether, dimethylethylsilylether and dimethylpropylsilylether. Of these silylethers, it is preferred that trimethylsilylether be employed.

The second component of the resist composition of the invention is a non-silicon-containing base polymer. The non-silicon-containing base polymer may be a homopolymer or a copolymer and may be acid sensitive or insensitive, yet base soluble. Such non-silicon-containing base polymers are typically well known to those skilled in the resist material art and are fully described, for example, in U.S. Pat. Nos. 4,491,628, 5,071,730 and 5,492,793, the contents of each being incorporated herein by reference.

Generally, the non-silicon-containing base polymer employed in the present invention is a homopolymer or higher polymer containing two or more repeating monomer units, e.g. copolymers or terpolymers, that is or can be made soluble in an alkaline solution. Moreover, the non-silicon-containing base polymer employed generally contains polar functional groups. The polar functional groups of the non-silicon-containing base polymer are preferably acidic functionalities such as hydroxyl or carboxyl functionalities.

Examples of suitable homopolymers that can be utilized in the present invention include, but are not limited to: phenolic-containing resins such as poly(hydroxystyrene) including the meta-, para- or ortho- substituted forms, and phenol formaldehydes; polymers having an acid or an anhydride group, e.g. polyacrylic acid, polymethacrylic acid or itaconic acid; sulfonamides; or acrylamide, imide or hydroxyimide group type polymers. Preferred homopolymers that can be employed as the non-silicon containing base polymer are poly(hydroxystyrene) (PHS), with the para form being the most preferred, vinylcyclohexanol, an acrylate, a methacrylate, an acrylamide, a methacrylamide, itaconate, itaconic acid, methacrylic acid, acrylic acid or a cycloolefin.

In regard to the non-silicon-containing base polymers which contain at least two monomer units, the monomer units employed in the present invention in forming such polymers are preferably selected from the group consisting of hydroxystyrene, styrene, acrylate, acrylic acid, methacrylic acid, vinylcyclohexanol, phenol formaldehyde, methacrylate, acrylamide, maleic anhydride, maleimide, itaconate, itaconic acid and cycloolefin. A highly preferred non-silicon-containing base polymer is one which contains at least two of the following monomer units: hydroxystyrene, styrene, vinylcyclohexanol, acrylic acid, methacrylic acid, acrylate or methacrylate.

The non-silicon-containing base polymer preferably also contains a polymeric backbone such as, but are not limited to: polyolefins, polyolefin sulfones, polysulfones, polycyclic olefins, polycarbonates, polyimides, polyketones, polyethers and the like. A highly preferred polymeric backbone for the non-silicon containing base polymer is polyethylene.

The non-silicon-containing base polymers employed in the present invention may or may not contain an acid sensitive protecting group. When present, the acid sensitive protecting groups employed are the same as those mentioned hereinabove, with the proviso that silicon-containing protecting groups are not employed with the non-silicon-containing polymer. In addition to having the acid sensitive protecting groups present on either the silicon containing polymeric additive or the non-silicon containing base polymer, it is also possible to have acid sensitive protecting groups present on both components. This embodiment is employed when acid liable groups are present on both polymeric compounds.

The third component of the radiation sensitive composition of the invention is a photoacid generator. The photoacid generators are preferably conventional compounds that generate an acid upon exposure to the desired radiation energy. Illustrative classes of photoacid generators include: nitrobenzyl compounds, onium salts, sulfonates, carboxylates and the like. Of these, onium salts are highly preferred. Particularly preferred onium salts include: iodonium salts and sulfonium salts.

The specific photoacid generator utilized in the present invention is a function of the type of radiation source utilized in patterning the radiation sensitive resist composition. That is, the specific photoacid generator is selected depending upon whether a mid-UV, a deep UV, an extreme UV, an e-beam, an X-ray or another radiation source is employed.

The fourth component of the radiation sensitive resist composition of the present invention is a solvent which dissolves both the silicon-containing and the non-silicon-containing polymers. Thus, such solvents as ethers, glycol ethers, aromatic hydrocarbons, ketones, esters and the like may be used. More specifically, ethers within the scope of the present invention include tetrahydrofuran. Of the glycol ethers, 2-methoxyethyl ether (diglyme), ethylene glycol monomethyl ether, propylene glycol monomethyl ether and propylene glycol monoether acetate are preferred. Toluene, xylene and benzene exemplify aromatic hydrocarbons preferred for use as the solvent of the irradiation sensitive resist composition of the present invention. Ketones which are especially preferred as the solvent of the present invention include: methylisobutylketone, 2-heptanone, cycloheptanone and cyclohexanone. Preferred esters include: ethyl lactate and ethoxy ethyl propanate.

The radiation sensitive resist composition of the invention may optionally include a photosensitizer. Photosensitizers that may be included in the irradiation sensitive composition of the invention are chromophores capable of absorbing radiation in the mid-UV, deep-UV, extreme-UV, X-ray or e-beam range. Preferred chromophores which provide this function include: anthracene methanol, coumarins, 9,10-bis (trimethoxysilylethynyl) anthracene and polymers containing these chromophores for mid-UV radiation.

Another optional component of the radiation sensitive resist composition of the invention is a base (acid scavenger). Preferred bases that may be included in the irradiation sensitive composition of the present invention are: berberine, ethyltrimethylammonium hydroxide, 1,8-bis (dimethylamino) napthalene, tetrabutyl ammonium hydroxide, amines, polymeric amines and the like.

Yet another optional component that may be included in the radiation sensitive resist composition of the present invention is a surfactant. Commercially available surfactants that are advantageously included in the irradiation sensitive composition include: FC-430, manufactured by Minnesota Mining & Manufacturing, a fluorine-containing surfactant and SILWET® surfactants manufactured by Union Carbide. The SILWET® surfactants contain siloxane.

The concentrations of the above discussed essential components that constitute the radiation sensitive resist composition of the invention preferably include a total polymer concentration of between about 1% and about 50%; and a photoacid generator concentration of between 0.001% and 15%; and a solvent concentration of between about 25% and about 99%, said percentages being by weight, based on the total of the radiation sensitive composition. More preferably, that total polymer concentration is between about 2% and about 30%; the photoacid generator concentration is between about 0.005% and about 10%; and from about 70% to about 95% solvent.

The aforementioned polymer concentration includes both the silicon-containing polymeric additive and the non-silicon-containing base polymer. The two polymers are present such that the silicon-containing polymer is preferably present in a concentration of between about 1% and about 40% while the non-silicon-containing base polymer is present in a concentration of between about 60% and about 99%, said percentages being by weight, based on the total weight of the two polymers. More preferably, the concentrations of polymers, relative to each other are: silicon-containing polymer additive about 2% to about 25% and non-silicon-containing base polymer, about 75% to about 98%. Still more preferably, the silicon-containing polymeric additive is present in an amount of between about 5% and about 15%, while the non-silicon-containing base polymer is present in an amount of between 85% and about 95%. Again, these percentages are by weight, based on the total weight of the polymeric constituents.

Where the radiation sensitive composition includes a photosensitizer, it is preferably present in a concentration of between about 0.001% and about 8%, more preferably about 0.002% to about 2%. In the event that the radiation sensitive composition includes a base, its concentration is between about 0.01% and about 16%, more preferably about 0.1% to about 6%. Similarly, when a surfactant is part of the radiation sensitive composition, its concentration is between about 100 ppm and about 1000 ppm, more preferably about 150 ppm to about 800 ppm, these concentrations and parts per million being by weight, based on the total weight of the resist composition.

The present invention also encompasses a process of forming a patterned resist film on a substrate. This process involves the application of the radiation sensitive resist composition of the invention to a substrate, e.g. organic ARC or organic substrate or other surface. In the process of the invention, a layer of the radiation sensitive composition of the invention is preferably disposed upon a substrate such as a semiconductor substrate, a wafer, or a circuit chip, magnetoresistive head or other magnetic head structure, micromachine substrate, etc. The deposition may be carried out using techniques well known to those skilled in the art including: spin-on coating, dip coating, brushing, spraying and other like deposition processes. While not critical to the present invention, the radiation sensitive composition preferably forms a layer having a thickness, after deposition, of from about 10 to about 5000 nm.

Preferably, the layer of radiation sensitive material is pre-baked prior to radiation exposure. Preferably, prebaking is carried out at a temperature of from about 30° to about 200° C. for a time period of from about 10 to about 600 seconds. Pre-baking preferably facilitates migration of silicon-containing polymeric additive toward the surface of the applied resist composition.

The disposed radiation sensitive composition is then patternwise exposed to radiation. The type of radiation and energy employed is not limited herein assuming that the composition is desirably responsive to the selected radiation. Thus, any conventional radiation source such as mid-UV (365 nm), DUV (248 nm)), extreme UV (193, 157 and 129 nm), X-ray, e-beam, ion beam and atomic beam can be employed in the present invention.

The photoacid generator included in the radiation sensitive composition generates an acid upon exposure. The thus generated acid reacts with the silicon containing and/or non-silicon containing polymers to create regions more soluble in alkaline basic solutions. Upon completion of the exposure process, a patterned resist film having an upper region enriched with silicon is provided.

After exposure, a post-baking step is optionally employed. Post-baking of the exposed radiation sensitive material is preferably carried out at a temperature of from about 30° to about 200° C. for a time period of from about 10 to about 600 seconds.

In another preferred embodiment of the present invention an ARC layer is disposed on the substrate prior to application of the radiation sensitive composition. Also, an attenuated phase shift mask may be employed during exposure to improve the resist image.

After exposure and any subsequent heating, the resist film having a silicon-enriched upper region is preferably contacted with an alkaline aqueous solution, i.e. a solution having a pH of more than 7. This aqueous alkaline solution dissolves the exposed portions of the resist to provide the desired pattern on the substrate.

It is again emphasized that the presence of the silicon containing additive in the radiation sensitive resist composition provides high resolution, improved profile control and etch resistance. Moreover, as shown in the examples, the resist composition of the present invention provides rectangular resist profiles. Additionally, the presence of the silicon-containing polymeric additive in the radiation sensitive resist provides a film having an upper surface region which is enriched with silicon. This film is more etch resistant than films not containing the silicon-containing polymeric additive.

The following examples are given to illustrate the scope and spirit of the present invention. The invention is not limited to the specific details of the examples.

EXAMPLE 1

90% HS/tBMA (68/32)+10 wt. % HS/4SiMA (80/20)+5 wt. % TBICS+0.50% TBAH 5 g of a copolymer of p-hydroxystyrene (HS, 65 mol %) and t-butylmethacrylate (tBMA, 35 mol %) was dissolved in 30.3 g of PGMEA with 0.556 g of a copolymer of 80 mol % of p-hydroxystyrene and 20 mol % of tris(trimethylsilyl)silylethyl methacrylate and 0.294 g of di(t-butylphenyl)iodonium camphoresulfonate, 0.588 g of 5 wt. % tetrabutylammonium hydroxide PGMEA solution. The resultant formulation was filtered through a 0.2 $\mu$m filter and spin coated on a 60 nm Shipley AR3 bottom antireflective coating (ARC) (which was applied and baked for 190° C. for 60 seconds). The resist film was subsequently baked at 140° C. for 120 seconds and exposed to 248 nm DUV light on a DUV stepper (0.63NA, ⅝ annular illumination) using a chrome on glass mask. This was followed by a post exposure baking of 130° C. for 90 seconds and a 30 seconds each double puddle development with a 0.263N TMAH developer. 190 nm equal line and space features were resolved at a dose of 18 mJ/cm$^2$ with rectangular top resist profile.

EXAMPLE 2

90% HS/tBMA (65/35)+10 wt. % HS/4SiMA (80/20)+5 wt. % TBICS+0.50% TBAH 5 g of a copolymer of p-hydroxystyrene (HS, 65 mol %) and t-butylmethacrylate (tBMA, 35 mol %) was dissolved in 30.3 g of PGMEA with 0.556 g of a copolymer of 80 mol % of p-hydroxystyrene and 20 mol % of tris(trimethylsilyl)silylethyl methacrylate and 0.294 g of di(t-butylphenyl)iodonium camphoresulfonate, 0.588 g of 5 wt. % tetrabutylammonium hydroxide PGMEA solution. The resultant formulation was filtered through a 0.2 $\mu$m filter and spin coated on a 60 nm Shipley AR3 bottom antireflective coating (ARC) (which was applied and baked for 190° C. for 60 seconds). The resist film was subsequently baked at 140° C. for 120 seconds and exposed to 248 nm DUV light on a DUV stepper (0.63NA, ⅝ annular illumination) using an attenuated phase shift mask. This was followed by a post exposure baking of 130° C. for 90 seconds and a 30 seconds each double puddle development with a 0.263N TMAH developer. 250 nm contact holes were resolved without any side lope printing at a dose of 36 mJ/cm$^2$.

EXAMPLE 3

95 wt. % HS/S/tBMA (65/20/15)+5 wt. % HS/4SiMA/tBMA (75/15/10)+5 wt. % TBICS+0.50% TBAH 4 g of a terpolymer of p-hydroxystyrene (HS, 65 mol %), styrene (S, 15 mol %) and t-butylmethacrylate (tBMA, 10 mol %) was dissolved in 27.8 g of PGMEA with 0.211 g of a terpolymer of p-hydroxystyrene (75 mol %) and tris (trimethylsilyl)silylethyl methacrylate (15 mol %) and t-butylmethacrylate (tBMA, 10 mol %) and 0.222 g of di(t-butylphenyl) iodonium camphoresulfonate, 0.446 g of 5 wt. % tetrabutylammonium hydroxide PGMEA solution. The resultant formulation was filtered through a 0.2 µm filter and spin coated on a 60 nm Shipley AR3 bottom antireflective coating (ARC) (which was applied and baked for 215° C. for 60 seconds). The resist film was subsequently baked at 140° C. for 60 seconds and exposed to 248 nm DUV light on a DUV stepper (0.63NA, ⅝ annular illumination) using a chrome on glass mask. This was followed by a post exposure baking of 140° C. for 60 seconds and a 30 seconds each double puddle development with a 0.263N TMAH developer. 170 nm equal line and space features were resolved at a dose of 18 mJ/cm$^2$ with a rectangular top resist profile.

EXAMPLE 4

90 wt. % HS/S/tBMA (65/20/15)+10 wt. % HS/ 4SiMA/tBMA (75/15/10)+5 wt. % TBICS+0.50% TBAH 4 g of a terpolymer of p-hydroxystyrene (HS, 65 mol %), styrene (S, 15 mol %) and t-butylmethacrylate (tBMA, 10 mol %) was dissolved in 24.2 g of PGMEA with 0.444 g of a terpolymer of p-hydroxystyrene (75 mol %) and tris (trimethylsilyl)silylethyl methacrylate (15 mol %) and t-butylmethacrylate (tBMA, 10 mol %) and 0.235 g of di(t-butylphenyl) iodonium camphoresulfonate, 0.470 g of 5 wt. % tetrabutylammonium hydroxide PGMEA solution. The resultant formulation was filtered through a 0.2 µm filter and spin coated on a 60 nm Shipley AR3 bottom antireflective coating (ARC) (which was applied and baked for 215° C. for 60 seconds). The resist film was subsequently baked at 140° C. for 60 seconds and exposed to 248 nm DUV light on a DUV stepper (0.63NA, ⅝ annular illumination) using a chrome on glass mask. This was followed by a post exposure baking of 140° C. for 60 seconds and a 30 seconds each double puddle development with a 0.263N TMAH developer. 190 nm equal line and space features were resolved at a dose of 18 mJ/cm$^2$ with a rectangular top resist profile.

EXAMPLE 5

95 wt. % HS/S/tBMA (65/20/15)+5 wt. % HS/ 4SiMA/tBMA (75/15/10)+5 wt. % TBICS+0.50% TBAH 4 g of a terpolymer of p-hydroxystyrene (HS, 65 mol %), styrene (S, 15 mol %) and t-butylmethacrylate (tBMA, 10 mol %) was dissolved in 27.8 g of PGMEA with 0.211 g of a terpolymer of p-hydroxystyrene (75 mol %) and tris (trimethylsilyl)silylethyl methacrylate (15 mol %) and t-butylmethacrylate (tBMA, 10 mol %) and 0.222 g of di(t-butylphenyl) iodonium camphoresulfonate, 0.446 g of 5 wt. % tetrabutylammonium hydroxide PGMEA solution. The resultant formulation was filtered through a 0.2 µm filter and spin coated on a 60 nm Shipley AR3 bottom antireflective coating (ARC) (which was applied and baked for 190° C. for 60 seconds). The resist film was subsequently baked at 140° C. for 120 seconds and exposed to 248 nm DUV light on a DUV stepper (0.63NA, ⅝ annular illumination) using a chrome on glass mask. This was followed by a post exposure baking of 130° C. for 90 seconds and a 30 seconds each double puddle development with a 0.263N TMAH developer. 170 nm equal line and space features were resolved at a dose of 28 mJ/cm$^2$ with a rectangular top resist profile.

EXAMPLE 6

90 wt. % HS/S/tBMA (65/20/15)+10 wt. % HS/ 4SiMA/tBMA (75/15/10)+5 wt. % TBICS+0.50% TBAH 4 g of a terpolymer of p-hydroxystyrene (HS, 65 mol %), styrene (S, 15 mol %) and t-butylmethacrylate (tBMA, 10 mol %) was dissolved in 24.2 g of PGMEA with 0.444 g of a terpolymer of p-hydroxystyrene (75 mol %) and tris (trimethylsilyl)silylethyl methacrylate (15 mol %) and t-butylmethacrylate (tBMA, 10 mol %) and 0.235 g of di(t-butylphenyl) iodonium camphoresulfonate, 0.470 g of 5 wt. % tetrabutylammonium hydroxide PGMEA solution. The resultant formulation was filtered through a 0.2 µm filter and spin coated on a 60 nm Shipley AR3 bottom antireflective coating (ARC) (which was applied and baked for 190° C. for 60 seconds). The resist film was subsequently baked at 140° C. for 120 seconds and exposed to 248 nm DUV light on a DUV stepper (0.63NA, ⅝ annular illumination) using a chrome on glass mask. This was followed by a post exposure baking of 130° C. for 90 seconds and a 30 seconds each double puddle development with a 0.263N TMAH developer. 150 nm equal line and space features were resolved at a dose of 38 mJ/cm$^2$ with a rectangular top resist profile.

While the invention has been particularly shown and described with respect to preferred embodiments thereof, it will be understood by those skilled in the art that the foregoing and other changes in form and details may be made therein without departing from the spirit and scope of the invention.

What is claimed is:

1. A radiation sensitive resist composition comprising:
   (a) a silicon-containing polymeric additive, wherein said silicon-containing polymeric additive is a siloxane homopolymer, a silsesquioxane homopolymer, a silyne homopolymer or a copolymer containing a co-monomer selected from the group consisting of a siloxane, a silsesquioxane and a silyne;
   (b) a non-silicon-containing base polymer, wherein said non-silicon-containing base polymer contains an acid sensitive protecting group and both (a) and (b) are aqueous base soluble after exposure processing;
   (c) a photoacid generator; and
   (d) a solvent.

2. The composition of claim 1 wherein said silicon-containing polymeric additive is a poly(hydroxphenyl alkyl) silsesquioxane or a poly(hydroxyphenyl alkyl) siloxane wherein alkyl is a $C_{1-30}$ moiety.

3. The composition of claim 2 wherein said hydroxyphenyl group is protected with an acid sensitive protecting group.

4. The composition of claim 1 wherein said silicon-containing polymeric additive is a homopolymer or a copolymer of a silicon-containing monomer comprising a silicon-containing substituent on a moiety selected from the group consisting of styrene, hydroxystyrene, an acrylate, an methacrylate, an acrylamide, a methacrylamide, itaconate, an itaconic half ester and a cycloolefin.

5. The composition of claim 4 wherein said silicon-containing substituent is a siloxane, or a cubic silsesquioxane.

6. The composition of claim 4 wherein said silicon-containing polymeric additive further includes a co-monomer selected from the group consisting of styrene, hydroxystyrene, acrylic acid, methacrylic acid, itaconic acid, maleic anhydride and itaconic anhydride.

7. The composition of claim 1 wherein said non-silicon-containing base polymer contains acidic functionalities.

8. The composition of claim 7 wherein said acidic functionalities are hydroxyl or carboxyl functional groups.

9. The composition of claim 1 wherein said non-silicon-containing base polymer contains a polymeric backbone selected from the group consisting of a polyolefin, a polyolefin sulfone, a polysulfone, a polycyclic olefin, a polycarbonate, a polyimide, a polyketone and a polyether.

10. The composition of claim 1 wherein said non-silicon-containing base polymer is a homopolymer or polymer having two or more monomer units.

11. The composition of claim 10 wherein said homopolymer is selected from the group consisting of a phenolic-containing resin, a polymer having an acid or anhydride group, a sulfonamide and an acrylamide-, imide- or hydroxyimide- group type polymer.

12. The composition of claim 11 wherein said homopolymer is a phenolic-containing resin.

13. The composition of claim 1 wherein said protecting group is selected from the group consisting of cyclic or branched aliphatic carbonyls, esters and ethers containing from 3 to 30 carbon atoms, acetals, ketals and aliphatic silylethers, with the proviso that the non-silicon-containing base polymer does not contain any silicon-containing protecting groups.

14. The composition of claim 13 wherein said protecting group is selected from the group consisting of phenolic carbonates, t-butoxylcarbonyloxy, isopropyloxycarbonyloxy, phenolic esters, t-butyl ether and benzyl ether.

15. The composition of claim 13 wherein said protecting group is selected from the group consisting of t-butyl ester, isobornyl ester, 2-methyl-2-admantyl ester, benzyl ester, 3-oxocyclohexanyl ester, dimethypropylmethyl ester, mevalonic lactonyl ester, 3-hydroxy-g-butyrolactonyl ester, 3-methyl-g-butylrolactonyl ester, bis(trimethylsilyl) isopropyl ester, trimethylsilylethyl ester, tris(trimethylsilyl) silylethyl ester, cumyl ester, tetrahydropyranyl ester, trimethysilylether, dimethylethylsilylether and dimethylpropylsilylether.

16. The resist composition of claim 13 wherein said acetal or ketal is selected from the group consisting of phenolic acetals or ketals, 2-methoxyethyl, tetrahydrofuranyl, tetrahydropyranyl, methoxycyclohexanyl, methoxycyclopentanyl, cyclohexanyloxyethyl, ethoxycyclopentanyl, ethoxycyclohexanyl, methoxycycloheptanyl and ethoxycycloheptanyl.

17. The composition of claim 1 further comprising at least one of the following: a base, a photosensitizer and a surfactant.

18. The composition of claim 1 wherein said composition contains about 1 to 50 wt. % total of said non-silicon-containing polymer and said silicon-containing polymeric additive, about 0.001 to 15 wt. % of said photoacid generator and about 25 to 99 wt. % of said solvent.

19. The composition of claim 18 wherein said composition contains about 2 to 30 wt. % total of said non-silicon-containing base polymer and said silicon-containing polymeric additive, about 0.005 to 10 wt. % of said photoacid generator and about 70 to 95 wt. % of said solvent.

20. The composition of claim 1 wherein said composition contains about 1 to 40 wt. % of said silicon containing polymer additive and about 60 to 99 wt. % of said non-silicon containing base polymer, wherein said wt. % is based upon the total weight of the polymer resin in said composition.

21. The composition of claim 20 wherein said composition contains about 2 to 25 wt. % of said silicon containing polymeric additive and about 75 to 98 wt. % of said non-silicon containing base polymer, wherein said wt. % is based upon the total weight of the polymer resin in said composition.

22. A film comprising a silicon-containing additive and a non-silicon containing additive, where said film has an upper surface enriched with said silicon and said silicon-containing additive is a siloxane homopolymer, a silsesquioxane homopolymer, a silyne homopolymer or a copolymer containing a co-monomer selected from the group consisting of a siloxane, a silsesquioxane and a silyne.

23. A process of forming a patterned resist film on a substrate comprising
  (a) providing a layer of the radiation sensitive resist composition onto a substrate, said resist composition comprising:
    (i) a silicon-containing polymeric additive wherein said silicon-containing polymeric additive is a siloxane homopolymer, a silsesquioxane homopolymer, a silyne homopolymer or a copolymer containing a co-monomer selected from the group consisting of a siloxane, a silsesquioxane and a silyne;
    (ii) a non-silicon-containing base polymer, wherein said non-silicon-containing base polymer contains an acid sensitive protecting group and both (i) and (ii) are aqueous base soluble after exposure processing;
    (iii) a photoacid generator; and
    (iv) a solvent;
  (b) patternwise exposing said resist layer to radiation whereby acid is generated in the radiation exposed portions of the said resist layer;
  (c) contacting said radiation exposed portions of said resist layer with an aqueous alkaline solution; and
  (d) removing the product of contact between the aqueous alkaline solution and said portions of said resist layer exposed to radiation.

24. The process of claim 23 further comprising the step of heating the resist layer to a temperature in the range of about 30° to 200° C. for a time period of about 10 to 600 seconds prior to step (b).

25. The process of claim 23 further comprising the step of heating the exposed resist layer to a temperature in the range of about 30° to 200° C. for a time period of about 10 to 600 seconds prior to step (c).

26. The process of claim 23 including the step of providing a layer of an antireflective compound onto said substrate prior to step (a).

* * * * *